US008988893B2

(12) United States Patent
Bar et al.

(10) Patent No.: US 8,988,893 B2
(45) Date of Patent: Mar. 24, 2015

(54) METHOD FOR ELECTRICAL CONNECTION BETWEEN ELEMENTS OF A THREE-DIMENSIONAL INTEGRATED STRUCTURE AND CORRESPONDING DEVICE

(75) Inventors: Pierre Bar, Grenoble (FR); Sylvain Joblot, Bizonnes (FR); Jean-Francois Carpentier, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 218 days.

(21) Appl. No.: 13/517,819

(22) Filed: Jun. 14, 2012

(65) Prior Publication Data

US 2012/0320550 A1    Dec. 20, 2012

(30) Foreign Application Priority Data

Jun. 15, 2011    (FR) ...................................... 11 55193

(51) Int. Cl.
| | | |
|---|---|---|
| H05K 1/11 | (2006.01) | |
| H01L 23/498 | (2006.01) | |
| H01L 21/48 | (2006.01) | |
| H01L 23/14 | (2006.01) | |

(52) U.S. Cl.
CPC ........ *H01L 23/49827* (2013.01); *H01L 21/486* (2013.01); *H01L 23/147* (2013.01); *H01L 2924/0002* (2013.01)
USPC ............................ 361/790; 361/760; 361/761

(58) Field of Classification Search
USPC .......................................... 361/790, 760, 832
See application file for complete search history.

(56) References Cited

U.S. PATENT DOCUMENTS

| | | |
|---|---|---|
| 3,714,706 A | 2/1973 | Reizman et al. |
| 2002/0074644 A1 | 6/2002 | Sankman |
| 2003/0094685 A1* | 5/2003 | Shiraishi et al. .............. 257/686 |

FOREIGN PATENT DOCUMENTS

| | | |
|---|---|---|
| DE | 3340926 A1 | 7/1984 |
| DE | 3709770 A1 | 10/1988 |
| DE | 19509202 A1 | 9/1995 |
| JP | 10270809 | 10/1998 |
| JP | 11233917 | 8/1999 |

* cited by examiner

*Primary Examiner* — Andargie M Aychillhum
(74) *Attorney, Agent, or Firm* — Allen, Dyer, Doppelt, Milbrath & Gilchrist, P.A.

(57) ABSTRACT

A link device for three-dimensional integrated structure may include a module having a first end face designed to be in front of a first element of the structure, and a second end face designed to be placed in front of a second element of the structure. The two end faces may be substantially parallel, and the module including a substrate having a face substantially perpendicular to the two end faces and carrying an electrically conducting pattern formed in a metallization level on top of the face and enclosed in an insulating region. The electrically conducting pattern may include a first end part emerging onto the first end face and a second end part emerging onto the second end face and connected to the first end part.

17 Claims, 6 Drawing Sheets

METHOD FOR ELECTRICAL CONNECTION BETWEEN ELEMENTS OF A THREE-DIMENSIONAL INTEGRATED STRUCTURE AND CORRESPONDING DEVICE

FIELD OF THE INVENTION

The invention relates to microelectronics, more specifically, to three-dimensional technological platforms, and to electrical interconnections through a silicon substrate.

BACKGROUND OF THE INVENTION

Vertical interconnection may be a challenge in three-dimensional technology. Currently, these vertical electrical interconnections are fabricated in silicon through links or vias, commonly denoted by those skilled in the art as Through Silicon Vias (TSV). The fabrication of these through vias TSV may raise some problems relating notably to their filling (for example, with copper) when a barrier and insulation layer is implemented. In order to reach satisfactory densities of TSVs, their form factor (height/diameter ratio) tends to be increased. This generally leads to the use of thinned semiconductor wafers, typically with a thickness less than 120 microns, which may pose a problem for gripping and stress during fabrication.

SUMMARY OF THE INVENTION

According to one embodiment, a three-dimensional technological form is provided that may provide an approach to the vertical electrical interconnection between various elements.

According to one aspect, a method is for electrical connection between at least one first element and one second element of a three-dimensional integrated structure. This method may comprise the fabrication of a link device, for example, an interposer, comprising at least one module having a first end face and a substantially parallel second end face. The module may comprise at least one substrate having a face substantially perpendicular to the two end faces. The method may also include carrying an electrically conducting pattern formed within at least one metallization level on top of the face and enclosed within an insulation region.

The electrically conducting pattern may comprise metal lines, advantageously formed by the same techniques as those used for the formation of the interconnection part (known by those skilled in the art under the acronym "BEOL: Back End Of Line") of an integrated circuit. The electrically conducting pattern may comprise at least one first end part emerging onto the first end face and at least one second end part emerging onto the second end face, this second end part being connected to the first end part.

In some embodiments, the method may comprise the formation of an electrical connection between the link device and the elements comprising at least one electrical connection between the first end part and the first element and at least one electrical connection between the second end part and the second element. Generally speaking, the formation of the electrical connection may comprise a relative positioning of the link device and of the two elements so as to place the first end face of the at least one module in front of a face of the first element and the second end face of the at least one module in front of a face of the second element.

According to a first embodiment, it is possible to form the at least one first emerging end part and the at least one second emerging end part before the positioning. However, in order to facilitate the later dicing step, it may be preferable to protect the end parts during the positioning.

It is for this reason that, according to another embodiment, the formation of the at least one first emerging end part and of the at least one second emerging end part may comprise operations carried out before the positioning and operations carried out after the positioning. More precisely, according to one embodiment, the fabrication of the link device may comprise the formation of an intermediate device, in which the at least one first end part and the at least one second end part are respectively coated with a protection layer, positioning of the intermediate device so as to place the first end face coated with its protection layer in front of a face of the first element and the second end face coated with its protection layer in front of a face of the second element, and after positioning of the intermediate device, exposure, for example, by etching or chemical mechanical polishing, of the at least one first end part and of the at least one second end part so as to make these end parts emerge onto their respective end face. In fact, irrespective of the embodiment, the typical vias TSV are replaced by an electrically conducting pattern, for example, metal lines that may have various shapes and dimensions.

The electrical connection between the various elements is then effected by way of the ends of these lines. It thus becomes possible to have an extremely fine pitch between the various vertical electrical links, associated with the etching precision of the technology used, and that could not be obtained with typical TSVs.

An extremely high form factor for these electrical links, typically greater than 200, can also be achieved, with reduced problems for orifice formation and filling as was the case in the fabrication of typical through vias. Heterogeneous materials can readily be used for the fabrication of the electrically conducting pattern. Furthermore, it may become easy to form vertical links incorporating, for example, various types of components such as passive components.

According to one embodiment, when the link device and the elements are designed to be stacked in a general stacking direction, for example, the vertical direction, the electrically conducting pattern may be formed on the at least one substrate which sits in a plane substantially perpendicular to the general stacking direction, in other words the horizontal plane. The positioning of the link device may then comprise a rotation of the link device, for example, by a quarter of a turn, so as to position the first end face substantially parallel to the first face of the first element, and to position the second end face of the module substantially parallel to the second face of the second element.

In other words, the pattern or patterns are formed in a typical manner on a substrate placed horizontally. The idea is that, during the step for assembly/placement, the modules thus formed are subjected to a step for rotation by 90°. Consequently, the horizontal metal lines may become de facto vertical electrical links. This step can be developed and included in the functionalities provided by an industrial tool known as a "flip chip bonding" tool. As previously indicated, the electrically conducting pattern can comprise elements of any given shape. However, generally, the electrically conducting pattern notably may comprise metal lines.

Thus, according to one embodiment, the formation of the electrically conducting pattern may comprise the formation, within the at least one metallization level, of a set of metal lines, at least some of which emerge onto the first end face in order to form at least one portion of the first end part, and onto the second end face in order to form at least one portion of the second end part. However, the formation of the electrically conducting pattern can also comprise the formation, on the face of the substrate, of several substantially parallel metallization levels mutually separated by insulating regions. Each metallization level may comprise a set of metal lines at least some of which emerge onto the first end face in order to form at least one portion of the first end part and onto the second end face in order to form at least one portion of the second end part. The metal lines formed on a metallization level may be totally insulated from the metal lines formed on another metallization level.

In other embodiments, it is possible for at least some of the lines of one metallization level to be connected to certain lines of other metallization levels depending on the topography of the desired final vertical electrical link. Thus, according to one embodiment, the formation of the electrically conducting pattern may comprise the formation of at least one electrically conducting interconnection hole (or via) between a metal line of one of the metallization levels and a metal line of another metallization level. These lines and these vias can be formed in a typical manner, for example, by a method of the double-Damascene type, as will be appreciated by those skilled in the art.

Although a metal line can run between the first end part of the module and the second end part of the module, it is also possible for some of the metal lines to be designed to connect two different locations of the same end part. Thus, according to one embodiment, the formation of the electrically conducting pattern may comprise the formation, within at least one metallization level, of a set of metal lines at least one of which emerges at two different locations on one of the two end faces, so as to respectively form at least one portion of the first or of the second end part.

So as to obtain a thicker module, it is also possible for the fabrication of the at least one module to comprise the fabrication of several elementary blocks, each comprising a substrate carrying an electrically conducting pattern formed in at least one metallization level, and a stacking of these elementary blocks. The formation of the electrical connection between the link device and the elements may comprise at least one electrical connection between the first end part of each pattern and the first element, and at least one electrical connection between the second end part of each pattern and the second element.

Thus, for example, each elementary block may comprise a substrate, preferably thinned, carrying one or more metallization levels, then the various elementary blocks are assembled, for example, by bonding, so as to form the module. The vertical electrical connection density can thus be increased. In practice, according to one embodiment, the fabrication of the modules may comprise the fabrication of an assembly comprising the modules as a block and the dividing up of the assembly between the modules, for example, by sawing, so as to obtain the modules. It is also possible to produce a link device comprising several assembled modules.

Thus, according to one embodiment, the fabrication of the link device may comprise the fabrication of several modules and the assembly of the modules in such a manner that the respective first end faces of the modules are in the same plane and form a first end face of the device, and in such a manner that the respective second end faces of the modules are in a second plane and form a second end face of the device. The assembly of the modules can comprise a step for rotation of the aforementioned modules, so as notably to transform the horizontal lines into vertical links. The link device may then be positioned so as to place its first end face in front of the face of the first element, and its second end face in front of a face of the second element. The method may comprise the formation of an electrical connection between the link device and the elements, this electrical connection comprising at least one electrical connection between the first end part of each pattern and the first element, and at least one electrical connection between the second end part of each pattern and the second element.

Another aspect is directed to a link device for a three-dimensional integrated structure. The link device may comprise at least one module having a first end face designed to be in front of a first element of the structure, and a second end face designed to be placed in front of a second element of the structure. The two end faces may be substantially parallel, and the module may comprise at least one substrate having a face substantially perpendicular to the two end faces and carrying an electrically conducting pattern formed in at least one metallization level on top of the face and enclosed in an insulating region. The electrically conducting pattern may comprise at least one first end part emerging onto the first end face and at least one second end part emerging onto the second end face and connected to the first end part.

According to one embodiment, the electrically conducting pattern may comprise, within the at least one metallization level, a set of metal lines, at least some of which comprising first ends emerging onto the first end face and second ends emerging onto the second end face. The at least one first end part of the pattern may comprise the first emerging ends and the at least one second end part of the pattern comprising the second emerging ends.

According to one embodiment, the electrically conducting pattern may comprise, on the face of the substrate, several substantially parallel metallization levels mutually separated by insulating regions. Each metallization level may comprise a set of metal lines, at least some of which comprising first ends emerging onto the first end face and second ends emerging onto the second end face. The at least one first end part of the pattern may comprise the first emerging ends of each set of lines, and the at least one second end part of the pattern may comprise the second emerging ends of each set of lines.

According to one embodiment, the electrically conducting pattern may comprise at least one electrically conducting interconnection hole between a metal line of one of the metallization levels and a metal line of another metallization level. According to another embodiment, the electrically conducting pattern may comprise, within at least one metallization level, a set of metal lines, at least one of which emerging at two different locations on one of the two end faces. The at least one first end part or the at least one second end part of the pattern may comprise the two ends of the at least one line emerging at the two different locations.

Additionally, the at least one module may comprise several stacked elementary blocks, each elementary block comprising a substrate carrying an electrically conducting pattern formed in at least one metallization level. The device may comprise several modules assembled in such a manner that the respective first end faces of the modules are in the same plane and form a first end face of the device, and in such a manner that the respective second end faces of the modules are in the same plane and form a second end face of the device. The first end face of the device may be designed to be in front of the face of the first element and the second end face of the device being designed to be in front of a face of the second element.

Another aspect is directed to a three-dimensional integrated structure comprising a link device such as defined hereinabove. At least one first element may be electrically coupled to the at least one first end part of at least one electrically conducting pattern, and at least one second element may be electrically coupled to the at least one second end part of at least one electrically conducting pattern.

BRIEF DESCRIPTION OF THE DRAWINGS

Other advantages and features of the invention will become apparent upon examining the detailed description of non-limiting embodiments and their implementation, and the appended drawings in which.

DETAILED DESCRIPTION OF THE PREFERRED EMBODIMENTS

Figure 1:
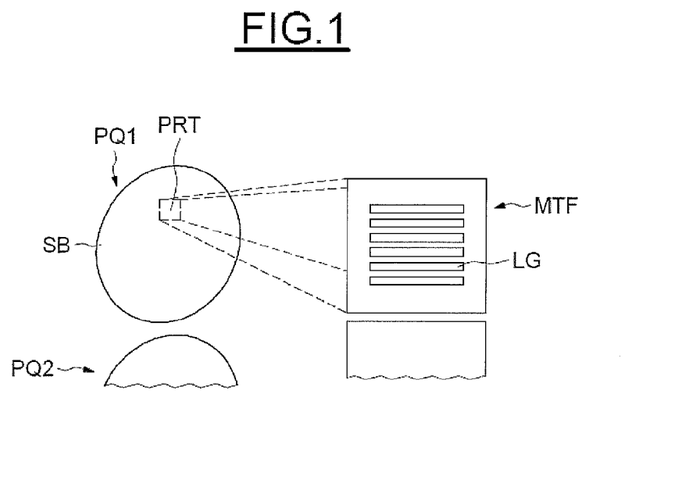
FIGS. 1 to 5 illustrate an embodiment of a method, according to the present invention.

In FIG. 1, the references PQ1 and PQ2 denote semiconductor wafers known to those skilled in the art, for example, discs of 200 or 300 mm diameter. On various portions PRT of the substrate SB (for example, made of silicon) of each wafer, an electrically conducting pattern MTF is formed on top of the plane upper face of the substrate here comprising electrically conducting lines, for example, parallel metal lines made of copper LG. These lines are formed within a metallization level in an analogous fashion to that used to form the interconnection part, or "BEOL", of an integrated circuit. A typical single- or double-Damascene method may for example be used.

The geometry of the pattern MTF is chosen here according to the final geometry of the desired vertical electrical link between various elements of a three-dimensional integrated structure. The minimum pitch for spacing between the lines LG is defined here by the etching precision of the technology used.

It goes without saying that, depending on the desired final topography for the vertical electrical link, several metallization levels may be formed on top of each portion PRT. The pattern MTF can then comprise, within each metallization level, a set of lines LG. Also, although the lines have been shown here as rectilinear and parallel, they may be of any given shape depending on the desired final geometry for the vertical link. Furthermore, at least some of the lines in different metallization levels can be connected together by conventional interconnection vias or holes. These lines and these vias can then be formed, for example, by a typical double-Damascene method.

Figure 2:
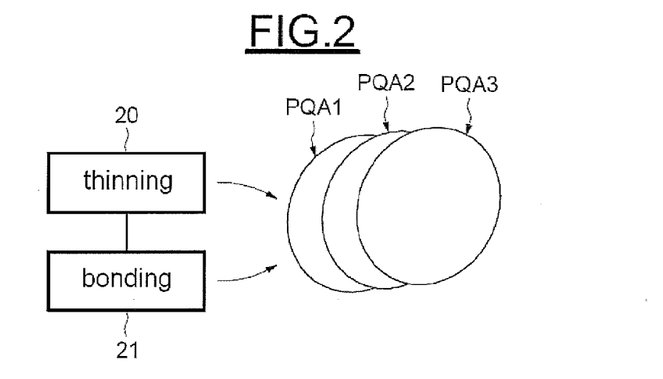

Then, as illustrated in FIG. 2, the various wafers PQi are preferably thinned (step 20) then assembled to one another, for example, by bonding 21, so as to obtain an assembly of thinned wafers PQAi, each carrying electrically conducting patterns. The various wafers PQi can be thinned, for example, to a thickness of 300 microns. The assembly ENS thus obtained is illustrated in more detail in FIG. 3.

Figure 3:
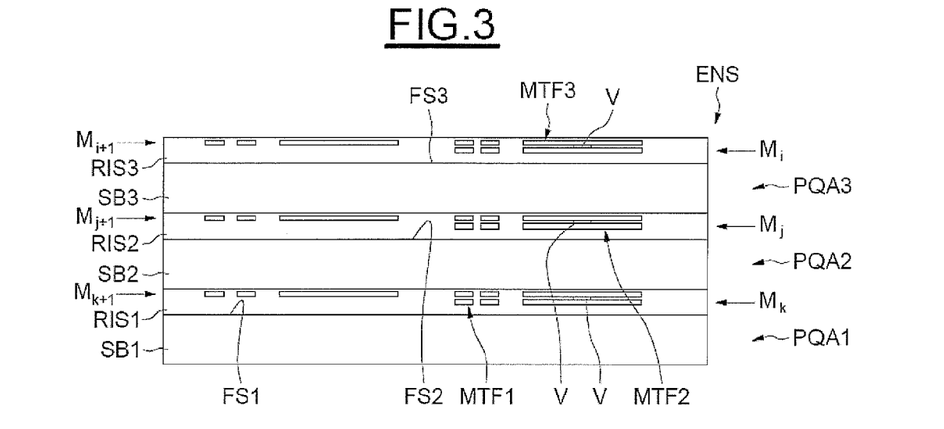

This assembly ENS comprises, in its lower part, the thinned wafer PQA1 comprising the thinned substrate SB1 carrying, on its plane upper face FS1, an insulating region RIS1 enclosing an electrically conducting pattern MTF1. This pattern MTF1 comprises metal lines formed within various metallization levels Mk, Mk+1. Some of these lines are furthermore mutually connected by vias V.

The thinned wafer PQA2 is situated on top of the insulating region RIS1 comprising the thinned substrate SB2 carrying, on its upper face FS2, an insulating region RIS2 enclosing another pattern MTF2 here also comprising metal lines formed within various metallization levels Mj, Mj+1. Here again, some of the metal lines in two adjacent metallization levels are mutually connected by vias V.

Lastly, the region RIS2 carries the thinned substrate SB3 of the wafer PQA3. The upper face FS3 of the substrate SB3 carries an insulating region RIS3 enclosing a third pattern MT3 also comprising metal lines formed within various metallization levels Mi, Mi+1. This assembly ENS in fact comprises various modules which will subsequently, as illustrated in FIG. 4, undergo a dicing operation 40, for example, a sawing operation, between the various modules of the assembly ENS so as to divide up these modules and to obtain individual modules MD.

Figure 4:
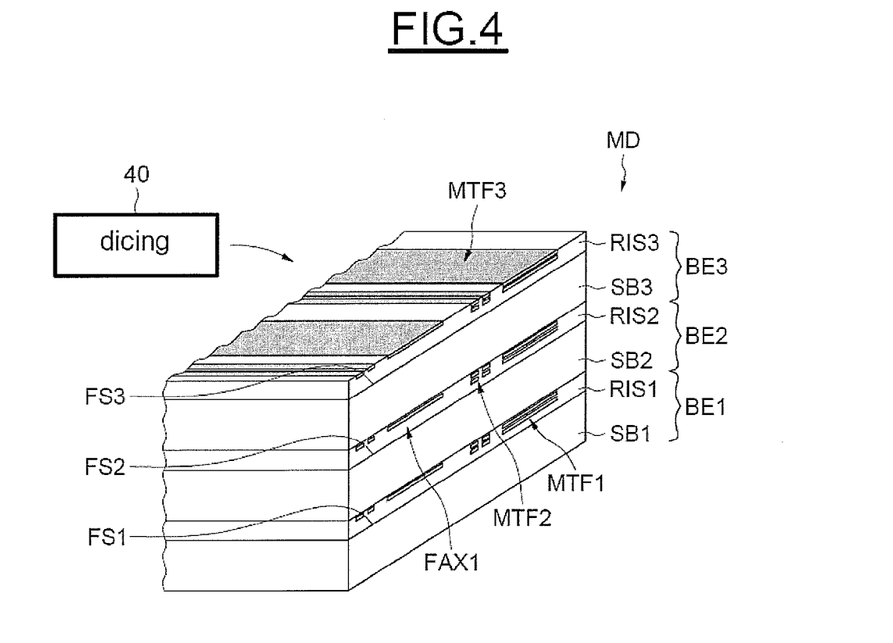

The module MD in FIG. 4, separated after the dicing process 40, therefore here comprises three elementary blocks BE1, BE2, BE3. Each elementary block BEi comprises a substrate SBi carrying on its upper face FSi an insulating region RISi incorporating an electrically conducting pattern MTFi.

As can furthermore be seen in FIG. 4, the metal lines of the various electrically conducting patterns emerge onto a face of the module here forming a first end face FAX1, this face FAX1 being perpendicular to the upper faces FSi of the substrates SBi. It should be noted that at least one of the substrates can be a high-resistivity silicon substrate (HR). At least one of the substrates can be an active silicon substrate, in other words incorporating active components, such as transistors. At least one of the substrates can comprise a material having a different coefficient of thermal expansion (CTE) (example: porous silicon) in order to allow a better mechanical resistance to temperature. At least one of the substrates can be formed by a ferromagnetic composite (e.g. YiG) in order to allow the fabrication of inductive elements.

Figure 5:
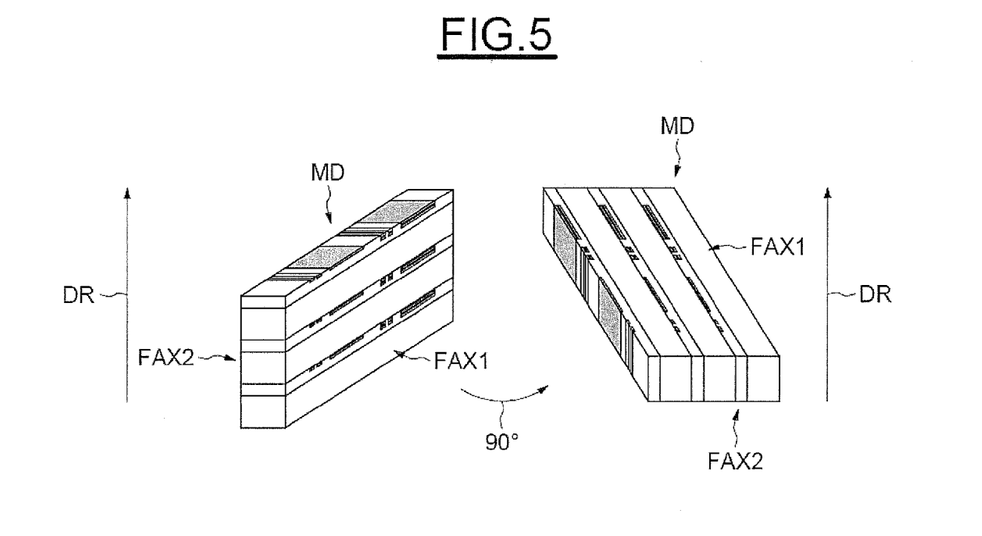

As illustrated in FIG. 5, the individual module MD also comprises a second end face FAX2 parallel to the first end face FAX1 and onto which also emerge at least some of the metal lines of the various electrically conducting patterns. Whereas the various metallization levels of the various electrically conducting patterns of the various modules are formed on the plane and horizontal upper faces of the substrates, and the various substrates are subsequently stacked in a vertical stacking direction DR, the modules MD then undergo a rotation of a quarter of a turn, in such a manner, as illustrated on the right-hand part of FIG. 5, that the two end faces FAX1 and FAX2 of the modules MD become horizontal, in other words perpendicular, to the direction of vertical stacking. The lines of the various patterns that are initially horizontal then become vertical lines and hence are ready to form vertical electrical links allowing, for example, two elements to be interconnected that will come respectively into contact on the emerging portions of the metal lines respectively situated on the faces FAX1 and FAX2, as will be explained in more detail hereinafter.

Figure 6:
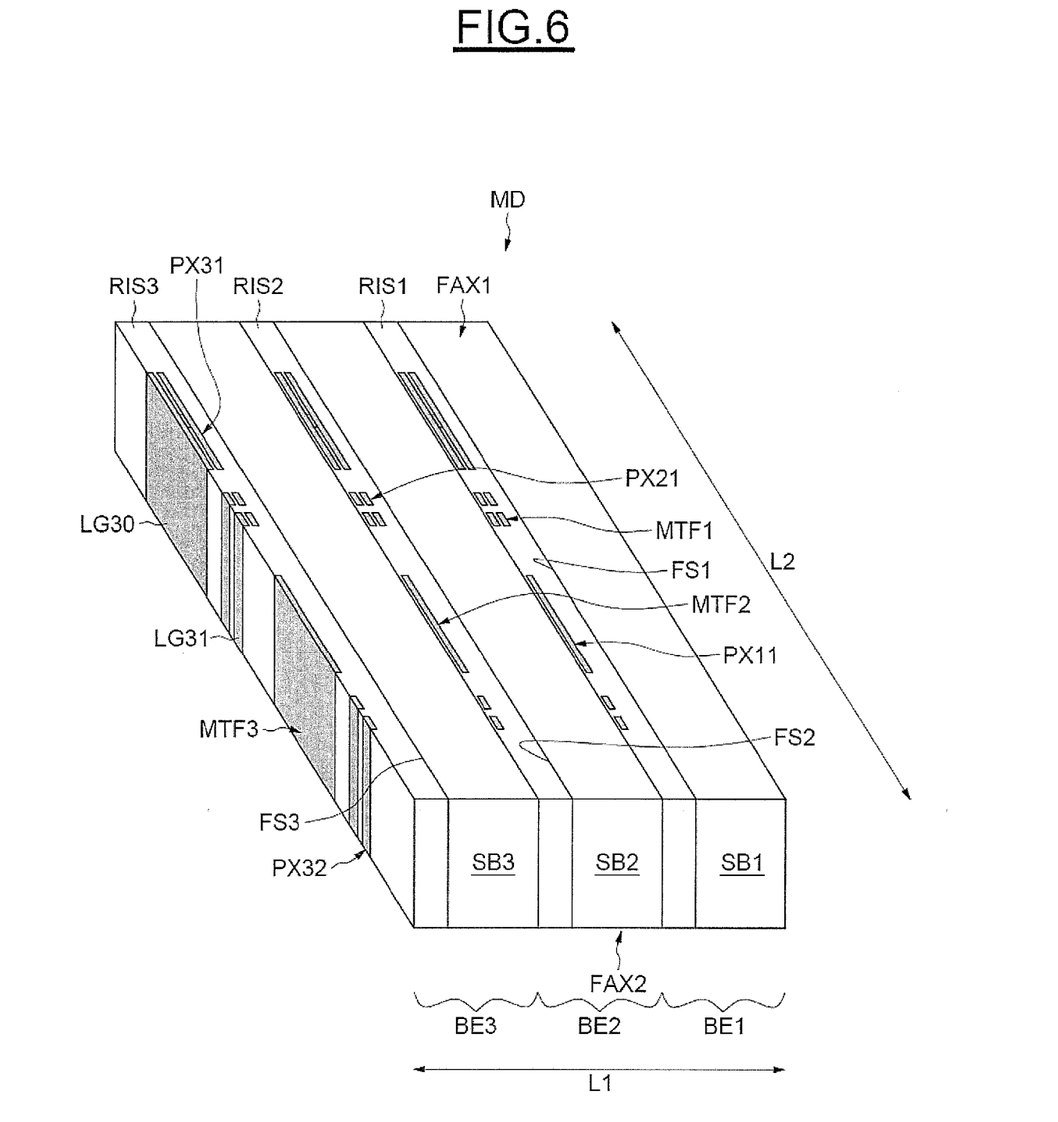
FIG. 6 illustrates another embodiment of a module of a link device, according to the present invention.

FIG. 6 illustrates the structure of a module MD in greater detail. The latter is shown after rotation by a quarter of a turn. On this module MD, the three elementary blocks BE1, BE2, BE3 can be seen, each comprising a substrate SBi carrying on their face FSi an insulating region RISi containing an electrically conducting pattern MTFi. The module MD comprises a first end face FAX1 perpendicular to the faces FSi of the substrates SBi, together with a second end face FAX2 parallel to the end face FAX1. Each electrically conducting pattern MTFi includes a first end part emerging onto the first end face FAX1 and a second end part emerging onto the second end face FAX2.

More precisely, the pattern MTF1 includes a first end part PX11 comprising the emerging ends of the various metal lines, whereas the second pattern MTF2 also comprises a first end part PX21 and the pattern MTF3 comprises a first end part PX31. The second end part of the pattern MTF3 is referenced PX32 and emerges onto the second end face FAX2.

As illustrated in FIG. 6, the patterns MTFi comprise metal lines, for example, the lines LG30 and LG31 of the pattern MTF3, running between the two end faces FAX1 and FAX2. These lines allow a first element in electrical contact with the first end portions PX11, PX21 and PX31 of the various patterns to be vertically interconnected with a second element in electrical contact with the second end parts of the various patterns. This is illustrated more particularly in FIG. 7.

Figure 7:
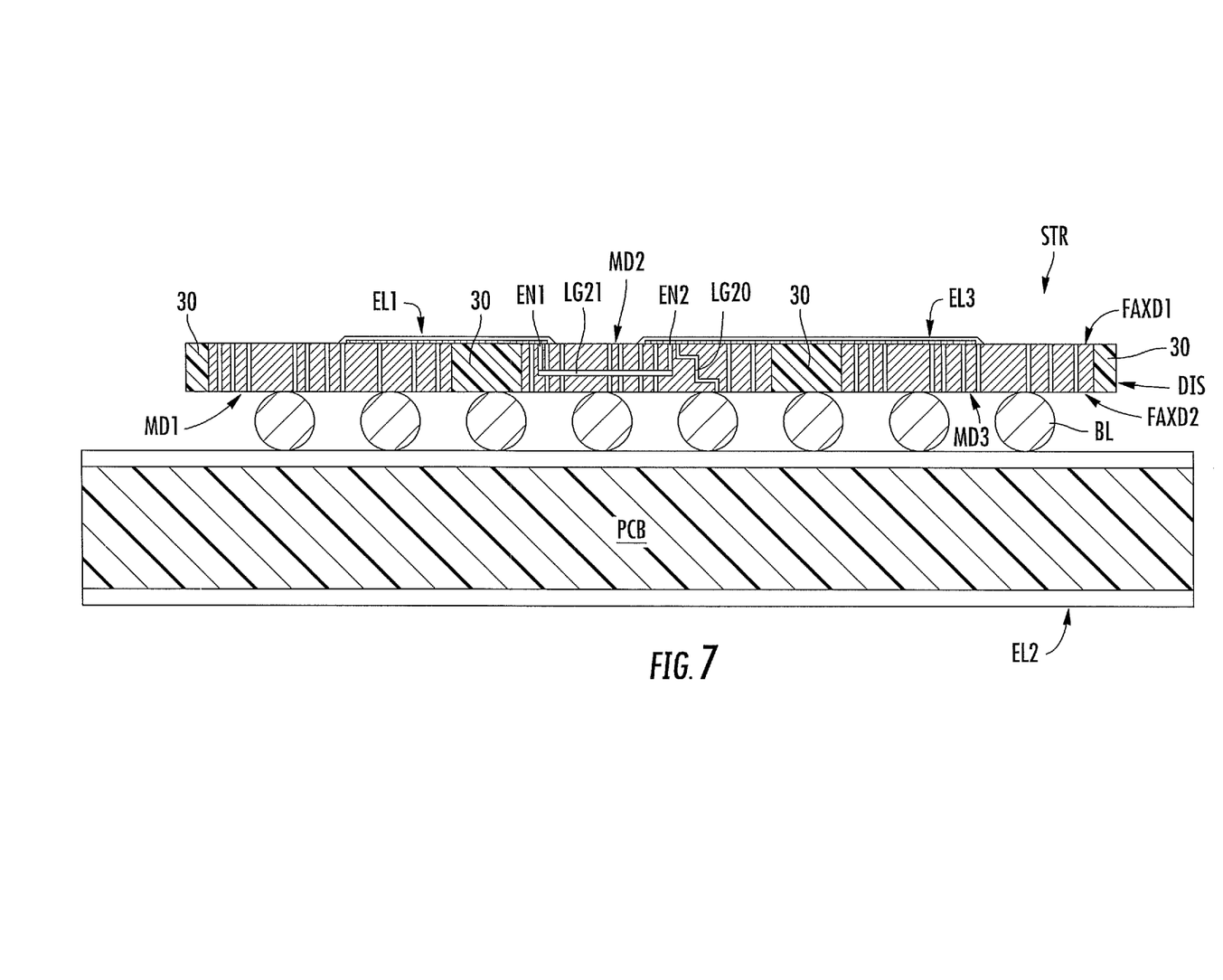
FIG. 7 illustrates an embodiment of a three-dimensional integrated structure, according to the present invention. incorporating an example embodiment of a link device, according to the present invention.

Before describing this figure, it should be noted that the length L1 of the module is fixed notably by the number of stacked thinned wafers. Typically, the length L1 is of the order of 0.5 to 2 mm. In contrast, the length L2 is not limited.

Furthermore, whereas the spacing pitch between the various modules is constant in the direction L1, and notably depends on the thickness of the thinned substrates, the spacing pitch between the various lines of the various patterns, in other words the pitch in the direction L2, is not constant.

If reference is now made more particularly to FIG. 7, which illustrates schematically one example of a three-dimensional integrated structure STR, it can be seen that the link device DIS comprises an assembly of several modules MD1, MD2, MD3. These various components can, for example, be mutually bonded as a block by a molding resin or else any other material 30 allowing such an assembly to be formed. This material can, for example, be a material with a lower coefficient of thermal expansion than that of silicon.

The first end faces FAX1 of the various modules are situated in the same plane so as to form a first end face FAXD1 for the device DIS. Similarly, the second end faces FAX2 of the various modules are situated in the same plane so as to form a second end face FAXD2 for the device DIS.

The assembly of the various modules can be carried out in an automated fashion by way of a machine programmed to place the various modules with respect to one another according to the desired final geometry of the final electrical interconnection. During this placement, the modules undergo the aforementioned rotation of a quarter of a turn.

The device DIS here forms a passive interposer allowing the three elements EL1, EL2 and EL3 to be electrically connected. More precisely, the elements EL1 and EL2 are, for example, integrated circuits, electrically connected on the first end face FAXD1 of the device DIS by way, for example, of connection beads or "bumps". Here the second element EL2 is an integrated circuit board (PCB: Printed Circuit Board) electrically connected to the second end face FAXD2 of the device DIS also by way of bumps BL.

The various bumps come into electrical contact, for example, by soldering, with the end parts of the various patterns, in other words the emerging ends of the various metal lines of the patterns. The vertical electrical link between the element EL2 and the elements EL1 and EL3 is thus ensured.

Furthermore, it is also possible to create two-dimensional vertical electrical links by forming, for example, a metal line LG20 with a staircase (or diagonal) shape allowing two elements (here the elements EL2 and EL3) to be vertically connected between two points not situated on the same vertical line. This advantageously allows the number of metal levels needed for the routing or for the redistribution to be limited.

Similarly, it is also possible, as illustrated by the line LG21, for two elements EL1 and EL3 disposed on the same end face FAXD1 of the device DIS to be electrically connected. For this purpose, the line LG21 emerges at two different locations EN1, EN2 on the face FAX1 of the corresponding module, here the module MD2.

It can therefore be seen that it is possible, according to one aspect, to very easily create routing levels with various shapes within the device DIS. Vertical electrical links are also obtained that can exhibit very high form factors with very tight spacing pitches. The final geometry of the vertical and/or horizontal electrical link between the various elements of the structure STR is obtained by the various geometries of the plane patterns MTF formed on the various substrates. At certain locations, high densities of vertical links and, in other locations, lower densities can thus be obtained.

Furthermore, electrically conducting patterns of all shapes can readily be formed, for example, inductive spirals or else capacitor electrodes. The present embodiments are not limited to the embodiments and implementations which have just been described but also cover all their variants.

Figure 8:
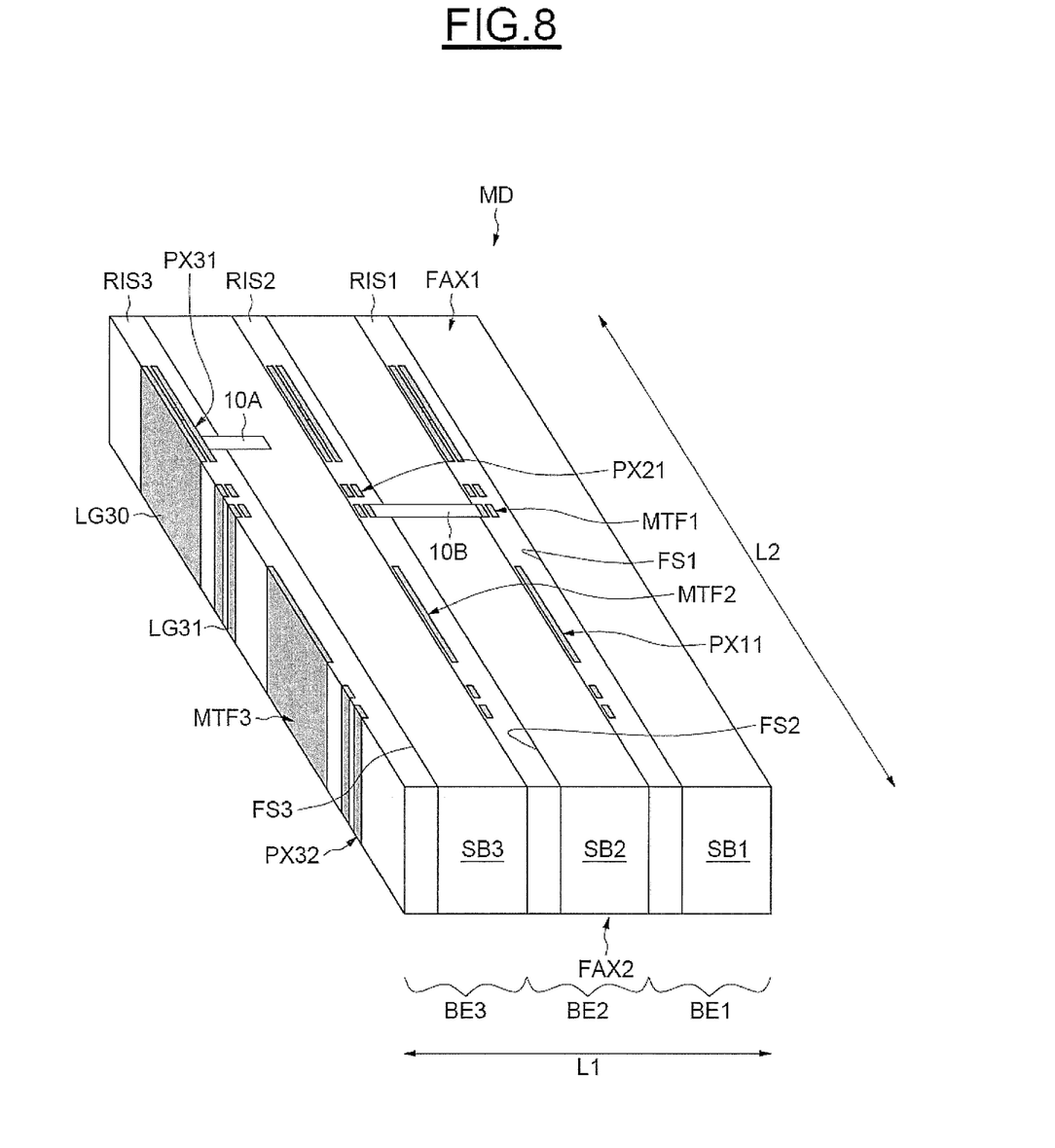
FIGS. 8 to 10 illustrate other embodiments, according to the present invention.

Thus, as illustrated in FIG. 8, it is possible to form, on top of at least one of the end faces, at least one redistribution metal line or layer (known by the acronym RDL: ReDistribution Layer), running parallel to this end face and contacting at least one of the end parts. This allows the possibility of connecting a connection bump between two end parts and thus reducing the connection pitch and/or of providing a greater flexibility in the location of the bumps.

In the example illustrated, a redistribution line 10A contacts a single end part PX31 and another 10B contacts two end parts of two adjacent patterns MTF1, MTF2. Of course, several levels of redistribution can be provided.

Figure 9:
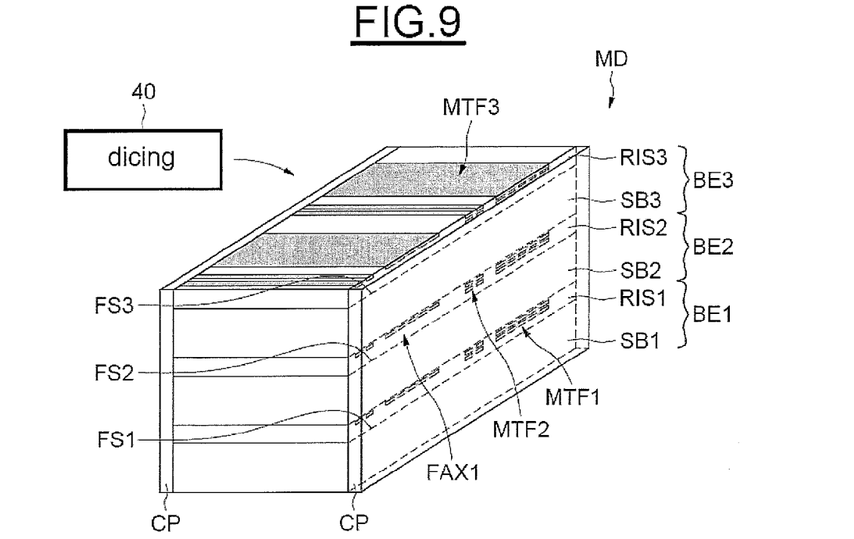
Figure 10:
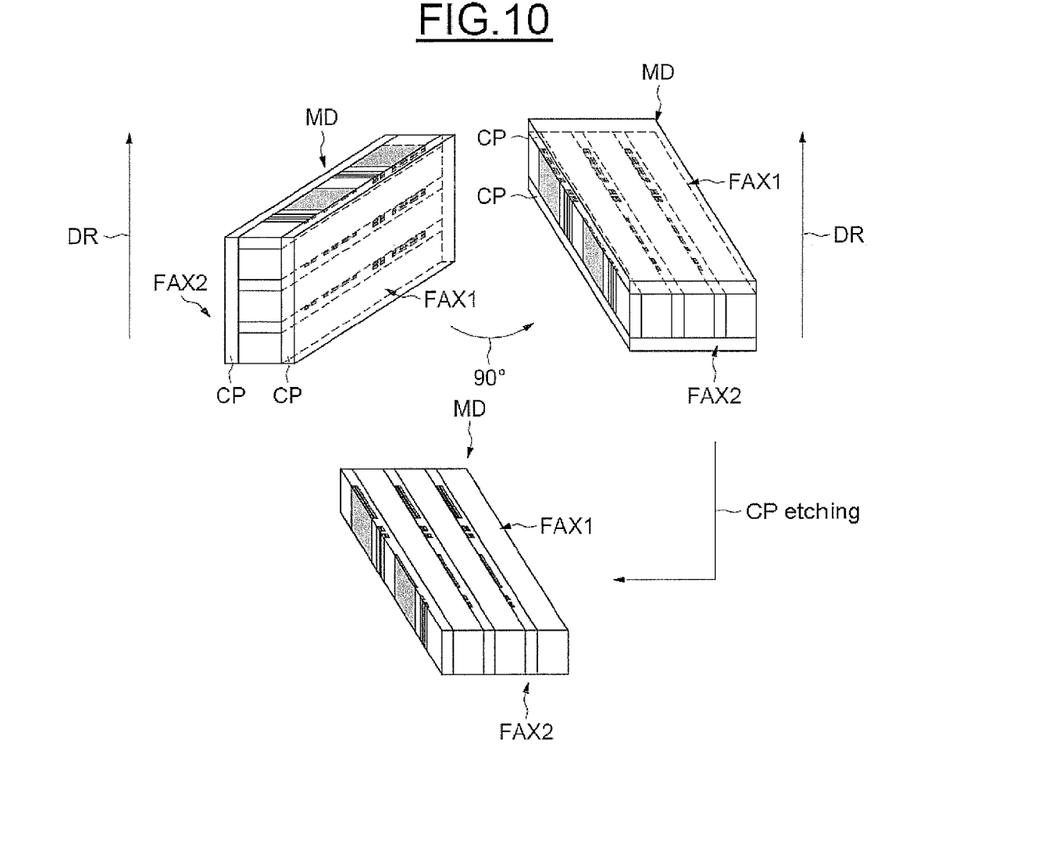

Furthermore, in the embodiments that have just been described, the emerging nature of the end parts has been created prior to the rotation of the device. However, in order to protect these end parts, coating these end parts with a protection layer CP prior to rotation may be included as illustrated in FIG. 9. This protection layer can be a part of the insulating region obtained during the dicing. Then, after rotation (FIG. 10), this protection layer CP is removed, for example, by chemical etching or chemical mechanical polishing, so as to expose the end parts.

That which is claimed is:

1. A link device for three-dimensional integrated structure comprising:
    a plurality of modules, each module having a first end face configured to be in front of a first element, and a second end face configured to be in front of a second element, the first end faces from said plurality of modules being in a first plane, the second end faces from said plurality of modules being in a second plane different from the first plane and being substantially parallel to the first plane;
    each module comprising at least one substrate having a surface substantially perpendicular to respective first and second end faces, at least one metallization level on top of the surface and defining an electrically conductive pattern, and an insulating region enclosing said at least one metallization level, said at least one metallization level defining an electrically conductive via extending substantially parallel to the surface and extending vertically between the first and second elements;
    said electrically conductive pattern comprising at least one first end part emerging onto the respective first end face, and at least one second end part emerging onto the respective second end face and connected to the at least one first end part.

2. The link device according to claim 1 wherein said electrically conductive pattern comprises a set of electrically conductive lines.

3. The link device according to claim 2 wherein said electrically conductive pattern comprises, on the surface of said at least one substrate, a plurality of substantially parallel metallization levels; and wherein each module comprises a plurality of insulating regions mutually separating said plurality of substantially parallel metallization levels.

4. The link device according to claim 3 wherein each metallization level comprises a set of electrically conductive lines, at least some of said set of electrically conductive lines comprising first ends emerging onto said respective first end face and second ends emerging onto said respective second end face.

5. The link device according to claim 4 wherein said electrically conductive pattern comprises at least one electrically conducting interconnection via between an electrically conductive line of one of the metallization levels and an electrically conductive line of another metallization level.

6. The link device according to claim 1 wherein said electrically conductive pattern comprises a set of electrically conductive lines, at least one of said set of electrically conductive lines emerging at two different locations on one of said respective first and second end faces, one of said at least one first end part and said at least one second end part of said electrically conductive pattern comprising two ends of the at least one line emerging at the two different locations.

7. The link device according to claim 1 wherein at least one of said substrates from said plurality of modules comprises at least one of a ferromagnetic composite, a material having a coefficient of thermal expansion different from at least one other substrate, and an active substrate.

8. The link device according to claim 1 further comprising at least one redistribution electrically conductive level contacting at least one of the at least one first and second end parts and running parallel to a corresponding end face.

9. The link device according to claim 1 further comprising a bonding material between said plurality of modules.

10. An electronic device comprising:
first and second elements; and
a link device connecting said first and second elements and comprising
a plurality of modules, each module having a first end face configured to be adjacent said first element, and a second end face configured to be adjacent said second element, the first end faces from said plurality of modules being in a first plane, the second end faces from said plurality of modules being in a second plane different from the first plane and being substantially parallel to the first plane,
each module comprising at least one substrate having a surface substantially perpendicular to respective first and second end faces, an electrically conductive pattern on the surface, and an insulating region enclosing said electrically conductive pattern, said electrically conductive pattern defining an electrically conductive via extending substantially parallel to the surface and extending vertically between the first and second elements,
said electrically conductive pattern comprising at least one first end part emerging onto the respective first end face, and at least one second end part emerging onto the respective second end face and connected to the first end part.

11. The electronic device according to claim 10 wherein said electrically conductive pattern comprises a set of electrically conductive lines.

12. The electronic device according to claim 10 wherein said electrically conductive pattern comprises, on the surface of said at least one substrate, a plurality of substantially parallel metallization levels; and wherein each module comprises a plurality of insulating regions mutually separating said plurality of substantially parallel metallization levels.

13. A link device comprising:
a plurality of modules, each module having a first end face configured to be adjacent a first element, and a second end face configured to be adjacent a second element, the first end faces from said plurality of modules being in a first plane, the second end faces from said plurality of modules being in a second plane different from the first plane and being substantially parallel to the first plane;
each module comprising at least one substrate having a surface substantially perpendicular to respective first and second end faces, an electrically conductive pattern on the surface, and an insulating region enclosing said electrically conductive pattern, said electrically conductive pattern defining an electrically conductive via extending substantially parallel to the surface and extending vertically between the first and second elements;
said electrically conductive pattern comprising at least one first end part emerging onto the respective first end face, and at least one second end part emerging onto the respective second end face and connected to the at least one first end part.

14. The link device according to claim 13 wherein said electrically conductive pattern comprises a set of electrically conductive lines.

15. The link device according to claim 14 wherein said electrically conductive pattern comprises, on the surface of said at least one substrate, a plurality of substantially parallel metallization levels; and wherein each module comprises a plurality of insulating regions mutually separating said plurality of substantially parallel metallization levels.

16. The link device according to claim 15 wherein each metallization level comprises a set of electrically conductive lines, at least some of said set of electrically conductive lines comprising first ends emerging onto said respective first end face and second ends emerging onto said respective second end face.

17. The link device according to claim 16 wherein said electrically conductive pattern comprises at least one electrically conducting interconnection via between an electrically conductive line of one of the metallization levels and an electrically conductive line of another metallization level.

* * * * *